United States Patent [19]

Grosse

[11] Patent Number: 4,925,806
[45] Date of Patent: May 15, 1990

[54] METHOD FOR MAKING A DOPED WELL IN A SEMICONDUCTOR SUBSTRATE

[75] Inventor: John K. Grosse, Encinitas, Calif.

[73] Assignee: Northern Telecom Limited, Montreal, Canada

[21] Appl. No.: 169,542

[22] Filed: Mar. 17, 1988

[51] Int. Cl.⁵ .................... H01L 21/265; H01L 21/70
[52] U.S. Cl. ........................................ 437/34; 437/57; 437/70; 437/38; 437/72; 148/DIG. 70; 357/42; 357/91
[58] Field of Search ...................... 437/25, 34, 38, 56, 437/57, 59, 70, 74, 229, 149, 147, 238, 239, 72; 347/42, 47, 44, 91; 148/DIG. 34, DIG. 30, DIG. 70

[56] References Cited

U.S. PATENT DOCUMENTS

| | | | |
|---|---|---|---|
| H204 | 2/1987 | Oh et al. | 437/72 |
| 3,921,283 | 11/1975 | Shappir | 437/34 |
| 3,962,717 | 6/1976 | O'Brien | 437/72 |
| 4,027,380 | 6/1977 | Deal et al. | 437/34 |
| 4,044,452 | 8/1977 | Abbas et al. | 437/72 |
| 4,135,955 | 1/1979 | Gasner et al. | 437/34 |
| 4,161,417 | 7/1979 | Yim et al. | 437/56 |
| 4,244,752 | 1/1981 | Henderson, Sr. et al. | 437/34 |
| 4,268,321 | 5/1981 | Meguro | 437/70 |
| 4,295,266 | 10/1981 | Hsu | 437/56 |
| 4,306,916 | 12/1981 | Wollesen et al. | 437/34 |
| 4,346,512 | 8/1982 | Liang et al. | 437/34 |
| 4,381,956 | 5/1983 | Lane | 437/72 |
| 4,409,726 | 10/1983 | Shiota | 437/34 |
| 4,412,375 | 11/1983 | Matthews | 437/70 |
| 4,412,378 | 11/1983 | Shinada | 437/72 |
| 4,420,872 | 12/1983 | Solo de Zaldivar | 437/70 |
| 4,426,766 | 1/1984 | Lee | 437/56 |
| 4,434,543 | 3/1984 | Schwabe | 437/70 |
| 4,435,895 | 3/1984 | Parrillo et al. | 437/70 |
| 4,435,896 | 3/1984 | Parrillo et al. | 437/34 |
| 4,444,605 | 4/1984 | Slawinski | 437/72 |
| 4,459,741 | 7/1984 | Schwabe | 437/34 |
| 4,466,171 | 8/1984 | Jochems | 437/34 |
| 4,516,316 | 5/1985 | Haskell | 437/57 |
| 4,535,532 | 8/1985 | Lancaster | 437/34 |
| 4,536,945 | 8/1985 | Gray et al. | 437/70 |
| 4,549,340 | 10/1985 | Nagasawa et al. | 437/70 |
| 4,554,726 | 11/1985 | Hillenius et al. | 437/34 |
| 4,556,585 | 12/1985 | Abernathey et al. | 437/34 |
| 4,558,508 | 12/1985 | Kinney et al. | 437/56 |
| 4,567,640 | 2/1986 | Fang et al. | 437/56 |
| 4,573,257 | 3/1986 | Hulsewek | 437/70 |
| 4,574,467 | 3/1986 | Halfacre et al. | 437/70 |

(List continued on next page.)

FOREIGN PATENT DOCUMENTS

| | | | |
|---|---|---|---|
| 0141571 | 5/1985 | European Pat. Off. | 437/34 |
| 0275508 | 7/1988 | European Pat. Off. | 437/34 |
| 0031978 | 3/1978 | Japan | 437/34 |
| 0124267 | 7/1983 | Japan | 437/34 |
| 0137244 | 8/1983 | Japan | 437/34 |
| 0210659 | 11/1984 | Japan | 437/34 |
| 0138955 | 7/1985 | Japan | 437/34 |
| 0226166 | 11/1985 | Japan | 437/57 |
| 0226169 | 11/1985 | Japan | 437/57 |
| 0088359 | 4/1987 | Japan | 437/34 |
| 0188359 | 8/1987 | Japan | 437/34 |
| 0248988 | 12/1987 | Japan | 437/57 |
| 0250722 | 1/1988 | Japan | 437/57 |
| 2056167 | 3/1981 | United Kingdom | 437/34 |
| 2118364 | 10/1983 | United Kingdom | 437/57 |

OTHER PUBLICATIONS

Ghandhi, *VLSI Fabrication Principles*, New York: John Wiley & Sons, Inc., 1983, pp. 214–216, 542–548.
Wolf et al., *Silicon Processing For The VLSI Era, vol. 1: Process Technology*, Lattice Press, 1986, pp. 407–458.

Primary Examiner—Brian E. Hearn
Assistant Examiner—M. Wilczewski
Attorney, Agent, or Firm—Foley & Lardner, Schwartz, Jeffery, Schwaab, Mack, Blumenthal & Evans

[57] ABSTRACT

A method for making a dopant well in a semiconductor substrate, wherein a dopant is implanted directly into an exposed surface of a semiconductor substrate through an opening in a dopant-absorbing coating and the substrate is heated to drive the implanted dopant further into the substrate. The method requires fewer steps than the conventional method, and is particularly applicable in the fabrication of CMOS devices.

4 Claims, 3 Drawing Sheets

U.S. PATENT DOCUMENTS

| | | | |
|---|---|---|---|
| 4,600,445 | 7/1986 | Horr et al. | 437/57 |
| 4,613,885 | 9/1986 | Haken | 437/34 |
| 4,626,450 | 12/1986 | Tani et al. | 437/34 |
| 4,637,128 | 1/1987 | Mizutani | 437/72 |
| 4,662,061 | 5/1987 | Malhi | 437/34 |
| 4,694,565 | 9/1987 | Custode | 437/34 |
| 4,697,332 | 10/1987 | Joy et al. | 437/57 |
| 4,713,329 | 12/1987 | Fang et al. | 437/34 |
| 4,732,869 | 3/1988 | van Attekun et al. | 437/34 |
| 4,749,662 | 6/1988 | Custode | 437/70 |
| 4,761,384 | 8/1988 | Neppl et al. | 437/34 |
| 4,767,721 | 8/1988 | Liao et al. | 437/34 |

METHOD FOR MAKING A DOPED WELL IN A SEMICONDUCTOR SUBSTRATE

BACKGROUND OF THE INVENTION

This present invention relates to a method for making a doped well in a semiconductor substrate.

In the manufacture of semiconductor devices it is frequently necessary to make a doped well in a semiconductor substrate. For example, in the manufacture of CMOS devices p-channel devices must be formed in n-type semiconductor and n-channel devices must be formed in p-type semiconductor. Thus, if CMOS devices are formed on an n-type substrate it is necessary to make p-type wells in the n-type substrate and form the n-channel devices within the p-type wells.

Conventionally, such doped wells are formed by growing a thick oxide on a semiconductor substrate, etching an opening through the thick oxide at a location where a doped well is desired, growing a thin oxide in the opening, implanting a dopant through the thin oxide, and heating in an oxidizing ambient to drive the dopant into the substrate.

The thick oxide absorbs dopant to prevent implantation in regions of the substrate where no dopant is desired. The thin oxide is universally used to reduce ion channeling effects which are generally believed to cause unacceptable deviations from the desired doping profile for the well. The drive-in step is done in an oxidizing ambient to thicken the thin oxide over the well. When this thickened oxide is removed, it leaves a recess in the substrate over the doped well. This recess is a visible feature which is used to locate the well for mask alignment in later processing steps.

SUMMARY OF THE INVENTION

It is therefore an object of the present invention provides a method for forming a doped well in a semiconductor substrate which requires fewer steps than the conventional method described above. Because the method according to the invention requires fewer steps, it has a lower cost and faster cycle time than the conventional method.

According to the invention there is provided a method for making a doped well in a semiconductor substrate, the method comprising:

forming a dopant absorbing coating on a semiconductor substrate, the coating having an opening therethrough exposing a surface of the substrate;

implanting a dopant into the substrate through the opening and the exposed surface of the substrate; an heating the substrate to drive the implanted dopant further into the substrate.

Preferably the method further comprises forming a recess in the exposed surface of the substrate to serve as a visible mask alignment feature in later processing steps. The recess may advantageously be formed by etching the exposed surface of the substrate through the opening between the implanting step and the heating step.

Preferably the method further comprises removing the dopant absorbing coating before heating the substrate, and heating the substrate in an oxidizing ambient to grow an oxide coating on the substrate. This oxide coating protects the substrate during the heating step and may be removed in subsequent processing steps.

A thick coating of photoresist may be used as the dopant absorbing coating.

BRIEF DESCRIPTION OF THE DRAWING

An embodiment of the invention will now be described by way of example only with reference to the accompanying drawings in which.

DETAILED DESCRIPTION OF THE PREFERRED EMBODIMENT

Figure 1A:
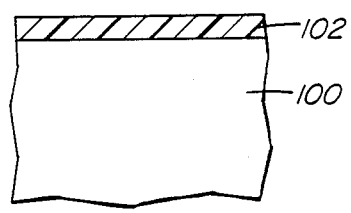
FIG. 1a–1i are cross-sectional views of a silicon substrate at successive stages in a conventional method for forming a p-type well in the substrate.
Figure 1B:
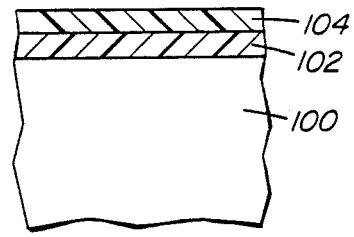
Figure 1C:
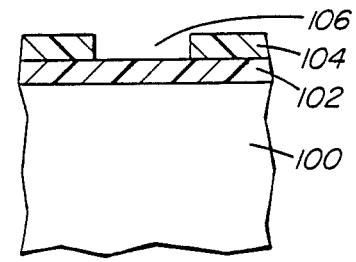
Figure 1D:
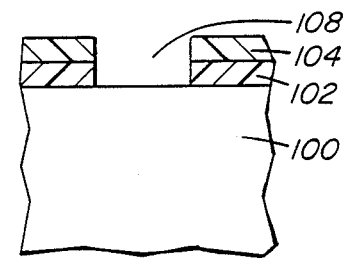
Figure 1E:
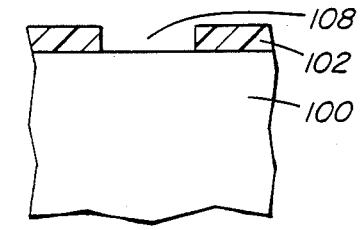
Figure 1F:
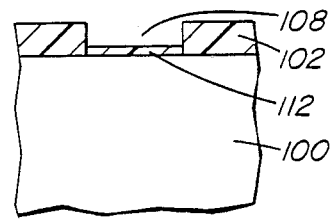

Referring to FIG. 1a–1i, in a conventional method for forming a p-type doped well in an n-type silicon substrate 100, a thick thermal oxide 102 is grown in a wet oxidizing ambient as shown in FIG. 1a. A layer 104 of photoresist is spun onto the oxidized substrate as shown in FIG. 1b. The photoresist layer 104 is exposed through a mask and developed to create an opening 106 in the photoresist layer 104 as shown in FIG. 1c. The thick oxide 102 is then chemically etched through the opening 106 in the photoresist layer 104 to create an opening 108 in the thick oxide 102, as shown in FIG. 1d. The photoresist layer 104 is then removed by chemical or plasma stripping as shown in FIG. 1e, and a thin thermal oxide 112 is grown within the opening 108 in a dry oxidizing ambient as shown in FIG. 1f.

Figure 1G:
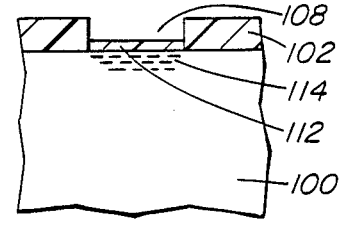
Figure 1H:
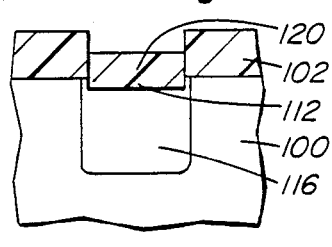
Figure 1I:
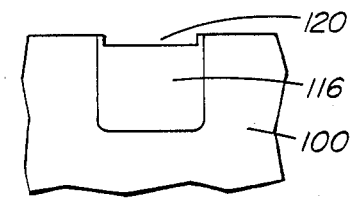

A boron dopant 114 is then implanted through the thin oxide 112 into the silicon substrate 100 as shown in FIG. 1g. The thick oxide 102 acts as a boron absorbing coating preventing implantation of the boron dopant into regions of the silicon substrate 100 which underlie the thick oxide 102. The thin oxide 112 reduces ion channeling effects which are generally believed to cause unacceptable deviations from the desired doping profile for the required dopant well. The silicon substrate 100 is then heated to drive the implanted boron 114 further into the silicon substrate 100 to define a p-type doped well 116 in the n-type silicon substrate 100 as shown in FIG. 1h. The heating step is carried out in an oxidizing ambient so as to thicken the oxides 102, 112. The thin oxide 112 grows faster than the thick oxide 102 since more oxygen is able to penetrate the thin oxide 112 than the thick oxide 102. Consequently a recess 120 is formed in the silicon substrate 100 under the thin oxide. The oxides 102, 112 are then chemically or reactive ion etched from the n-type substrate 100 leaving the p-type doped well 116 and recess 120 as shown in FIG. 1i. The recess 120 is used to visually locate the doped well 120 when aligning masks for subsequent processing steps, for example the formation of n-channel devices in the p-type well 116.

Figure 2A:
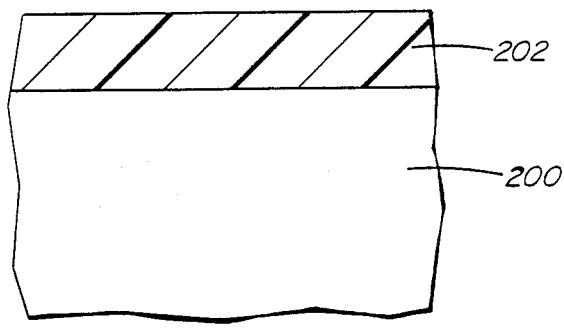
FIGS. 2a–2g are cross-sectional views of a silicon substrate at successive stages in a method according to the embodiment for forming a p-type well in the substrate.
Figure 2B:
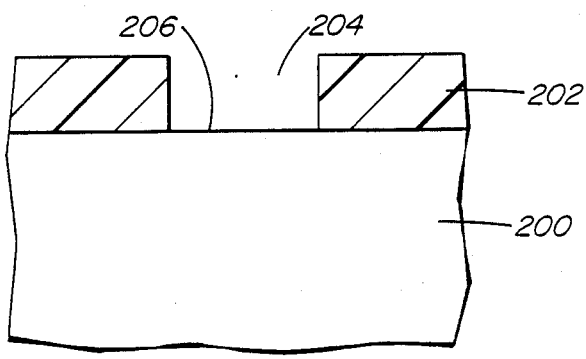

Referring to FIGS. 2a–2g, in a method according to the embodiment for forming a p-type well in an n-type silicon substrate 200, a thick layer 202 of photoresist is spun onto the silicon substrate 200 as shown in FIG. 2a. The photoresist layer 202 is exposed through a mask and developed to create an opening 204 in the photoresist layer 202 which exposes a surface 206 of the silicon substrate 200 as shown in FIG. 2b.

Figure 2C:
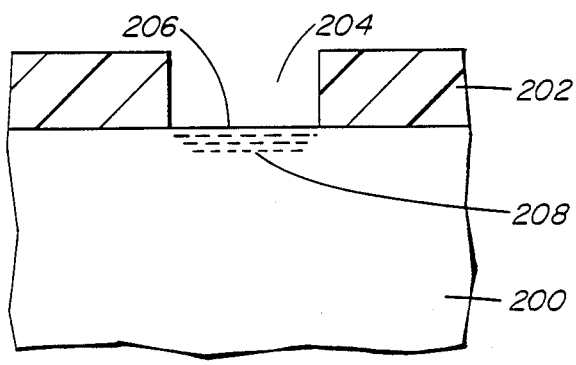
Figure 2D:
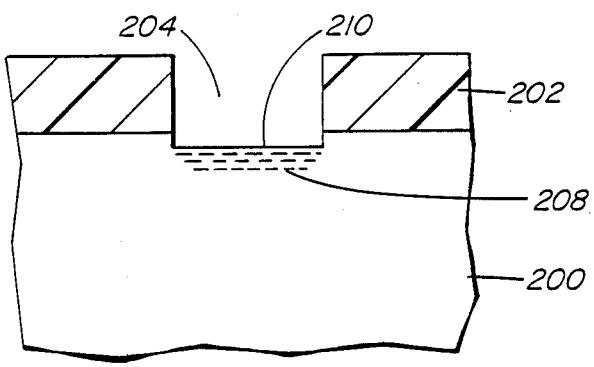
Figure 2E:
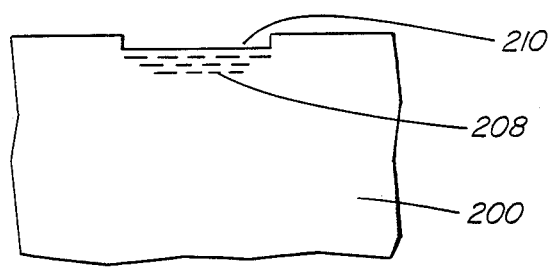
Figure 2F:
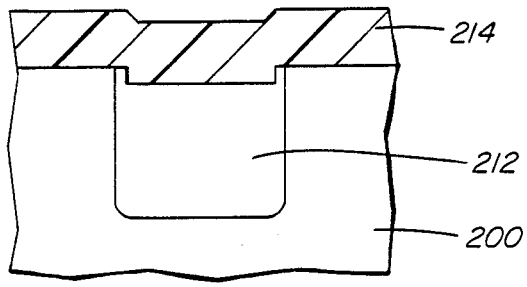
Figure 2G:
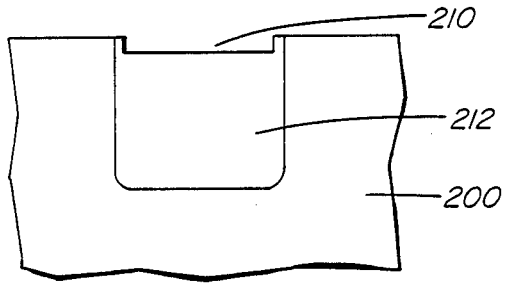

A boron dopant 208 is then implanted into the silicon substrate 200 through the opening 204 and exposed surface 206 of the silicon substrate 200 as shown in FIG. 2c. The thick photoresist layer 202 acts as a boron absorbing coating preventing implantation of the boron dopant into regions of the silicon substrate 200 which underlie the thick photoresist layer 202. The exposed surface 206 of the silicon substrate 200 is then chemically or reactive ion etched through the opening 204 to form a recess 210 as shown in FIG. 2d. The photoresist layer 202 is then removed by chemical or plasma stripping as shown in FIG. 2e, and the silicon substrate 200 is heated to drive the implanted boron 208 further into the silicon substrate 200 to define a p-type doped well 212 in the n-type silicon substrate 200 as shown in FIG. 2f. The heating step is carried out in an oxidizing ambient so as to grow an oxide 214 on the silicon substrate 200. The oxide 214 protects the silicon substrate 200 during the heating step and is chemically or reactive ion etched from the n-type substrate 200 leaving the p-type doped well 212 and recess 210 as shown in FIG. 2g. The recess 210 is used to visually locate the doped well 212 when aligning masks for subsequent processing steps, for example the formation of n-channel devices in the p-type well 212.

The method according to the embodiment shown in FIGS. 2a–2g differs from the conventional method shown in FIG. 1a–1i in that the boron dopant 208 is implanted into an exposed surface of the silicon substrate 200. In the conventional method, the boron dopant 112 is implanted into the silicon substrate 100 through a thin oxide 112. Such a thin oxide 112 is universally used to reduce ion channeling effects which are generally believed to cause unacceptable deviations from the desired doping profile for the p-type well 116.

Figure 3:
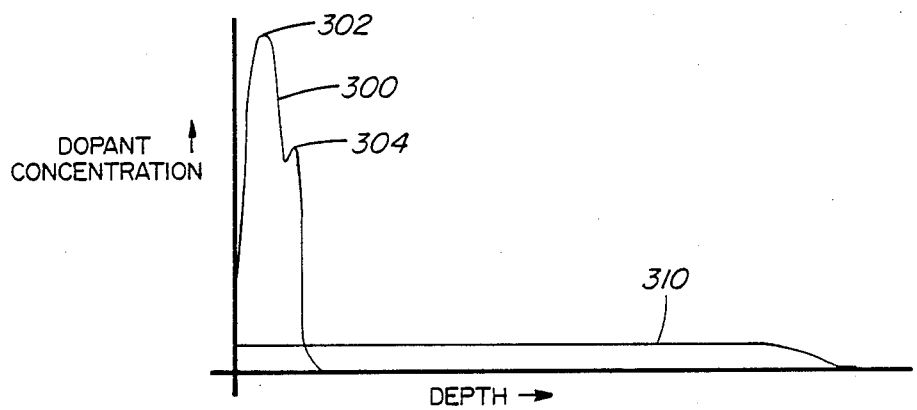
FIG. 3 is plot showing dopant concentration versus depth at two successive stages in the method according to the embodiment.

FIG. 3 shows dopant concentration as a function of depth before and after the heating step of the method according to the embodiment. The doping profile before the heating step, as shown at reference numeral 300, exhibits a primary peak 302 near to the surface 206 of the silicon substrate 200 and a secondary peak 304 further from the surface 206. The secondary peak 304 is due to ion channeling effects which are avoided through the use of the thin oxide 112 in the conventional method. However, the heating step of the method according to the embodiment causes the boron dopant to diffuse further into substrate 200 flattening the doping profile until the primary and secondary peaks are no longer detectable and have no significant deleterious effects on devices formed in the p-type well 212. This is shown at reference numeral 310 which indicates the doping profile after the heating step in the method according to the embodiment. Thus the use of the thin oxide 112 to avoid ion channeling effects in the conventional method appears unnecessary particularly in the formation of deeply diffused doped wells.

The method according to the embodiment eliminates two oxide growth steps and one oxide etch step of the conventional method. The elimination of these steps provides a reduction in process cost and cycle time.

The silicon surface etch step of the method according to the embodiment, which is not required in the conventional method, is used only to render the doped well visible for mask alignment in subsequent processing steps. This step can be eliminated from the method according to the embodiment where alternative methods of making the doped well visible are used or where alternative mask alignment procedures are used. Even when the silicon surface etch step is included, the method according to the embodiment requires fewer steps than the conventional method.

The silicon surface etch step of the method according to the embodiment can be performed before or after the implantation step. When the silicon surface etch step is performed after implantation, some of the implanted dopant is removed along with silicon which is etched away. This loss of dopant must be taken into account when calculating the dopant dose and implantation energy.

Any suitable dopant absorbing coating may be used in the place of the thick layer 202 of photoresist. The selection of an appropriate photoresist and calculation of the thickness required to absorb a particular dopant at a particular implantation energy is based on tabulated data available in standard references, for example the Semiconductor Technology Handbook, Technology Associates, 1985, ISBN 0-932787-00-2.

Dopants other than boron and substrates of semiconductor materials other than silicon may also be used.

I claim:

1. A method for making a doped well in a semiconductor, comprising the steps of:
   forming a dopant-absorbing coating comprising a photoresist directly on a semiconductor susbtrate, the coating having an opening therethrough exposing the entire surface of the substrate which lies within the opening;
   implanting a dopant into the substrate through the opening and the exposed surface of the substrate;
   subsequent to the implanting step, etching the exposed surface of the substrate through the opening to form a recess in the substrate, whereby the etching removes a predetermined amount of the substrate and a predetermined amount of the implanted dopant;
   removing the dopant-absorbing coating;
   heating the substrate in an oxidizing ambient to drive the remaining implanted dopant further into the substrate and to grow an oxide on the substrate; and
   removing the oxide from the substrate prior to further processing.

2. A method for making a doped well in a semiconductor substrate, comprising the steps of:
   forming a dopant-absorbing coating comprising a photoresist directly on a semiconductor substrate, the coating having an opening therethrough exposing the entire surface of the substrate which lies within the opening;
   etching the exposed surface of the substrate through the opening to form a recess in the substrate;
   subsequent to the etching step, a dopant into the substrate through the opening and the exposed surface of the substrate;
   removing the dopant-absorbing coating;
   heating the substrate in an oxidizing ambient to drive the implanted dopant further into the substrate and to grow an oxide on the substrate; and
   removing the oxide from the substrate prior to further processing.

3. A method as defined in claim 1 or 2, wherein the substrate is a silicon substrate.

4. A method as defined in claim 1 or 2, wherein the dopant is boron.

* * * * *